United States Patent
Lojek

(12) 
(10) Patent No.: US 6,998,670 B2
(45) Date of Patent: Feb. 14, 2006

(54) TWIN EEPROM MEMORY TRANSISTORS WITH SUBSURFACE STEPPED FLOATING GATES

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 94 days.

(21) Appl. No.: 10/785,160

(22) Filed: Feb. 23, 2004

(65) Prior Publication Data

US 2004/0212005 A1  Oct. 28, 2004

Related U.S. Application Data

(63) Continuation-in-part of application No. 10/423,637, filed on Apr. 25, 2003, now Pat. No. 6,919,242, and a continuation-in-part of application No. 10/465,718, filed on Jun. 18, 2003, now Pat. No. 6,888,192, and a continuation-in-part of application No. 10/680,355, filed on Oct. 6, 2003.

(51) Int. Cl.
*H01L 27/108* (2006.01)

(52) U.S. Cl. ................ 257/315; 257/315; 257/316
(58) Field of Classification Search ............ 257/315, 257/316, 317, 318
See application file for complete search history.

(56) References Cited

U.S. PATENT DOCUMENTS

| | | | |
|---|---|---|---|
| 4,807,188 A * | 2/1989 | Casagrande | 365/185.05 |
| 5,424,233 A | 6/1995 | Yang et al. | 437/43 |
| 5,917,215 A | 6/1999 | Chuang et al. | 257/321 |
| 6,043,530 A | 3/2000 | Chang | 257/320 |
| 6,323,088 B1 | 11/2001 | Gonzalez et al. | 438/257 |
| 2002/0074583 A1 | 6/2002 | Sugiyama et al. | 257/298 |

* cited by examiner

*Primary Examiner*—David Nelms
*Assistant Examiner*—Thinh T Nguyen
(74) *Attorney, Agent, or Firm*—Schneck & Schneck; Thomas Schneck; David M. Schneck

(57) ABSTRACT

A memory array with memory cells arranged in rows and columns with each cell having twin EEPROMs featuring subsurface stepped floating gates for electric field concentration. The twin EEPROMs employ only a single layer of poly, one portion being a floating gate of each EEPROM and another portion being word lines. The twin EEPROMs share a common subsurface electrode by having diffused control lines and a diffused bit line. The two EEPROMs are symmetric across the common electrode.

11 Claims, 5 Drawing Sheets

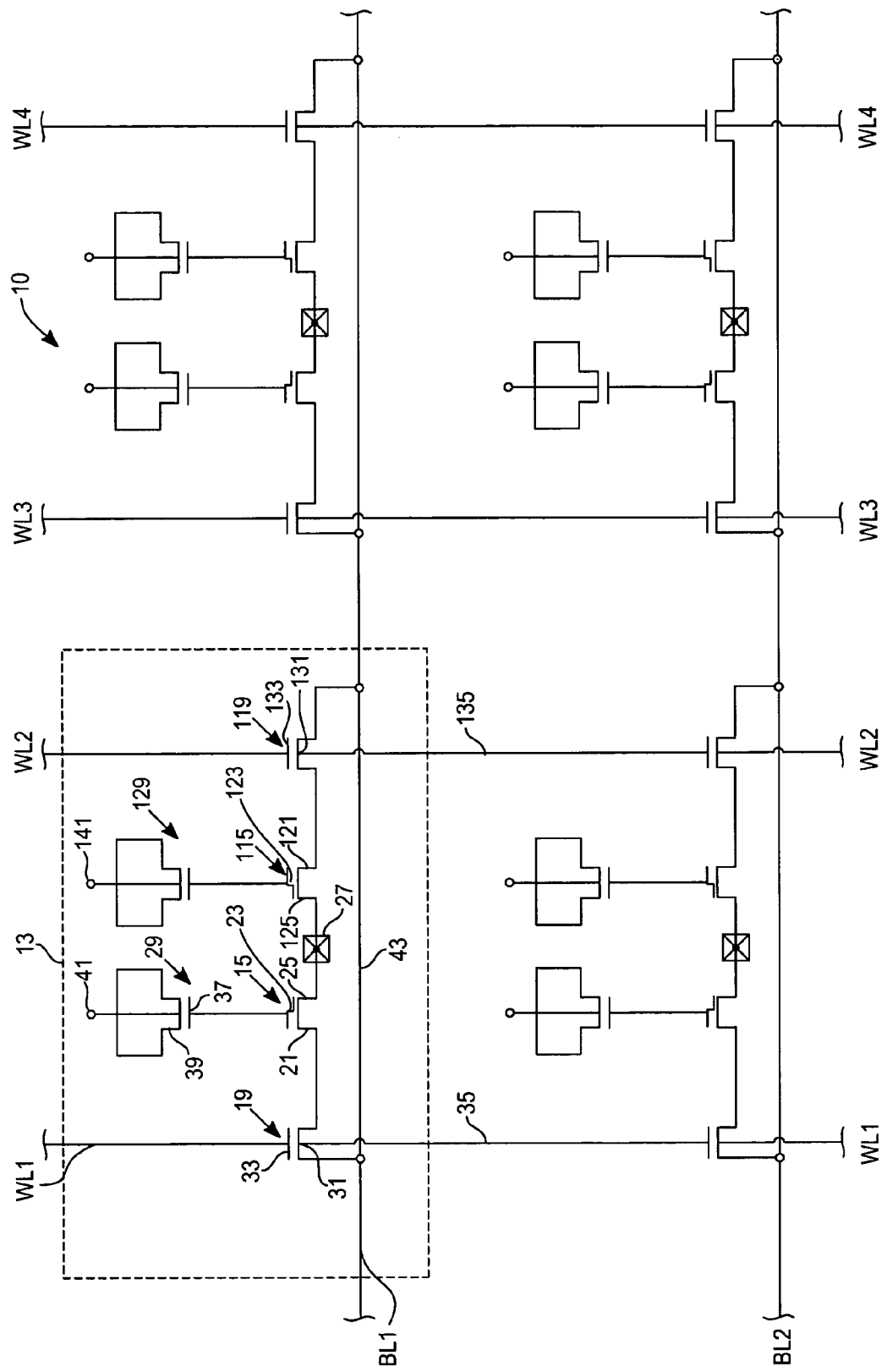
Fig._1

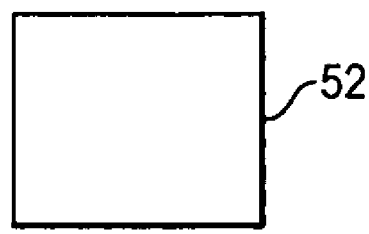
Fig._3
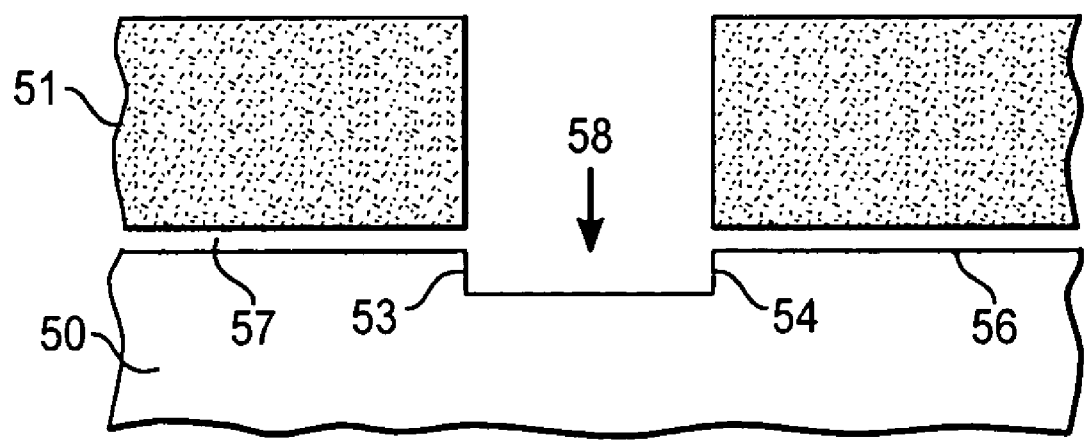
Fig._2

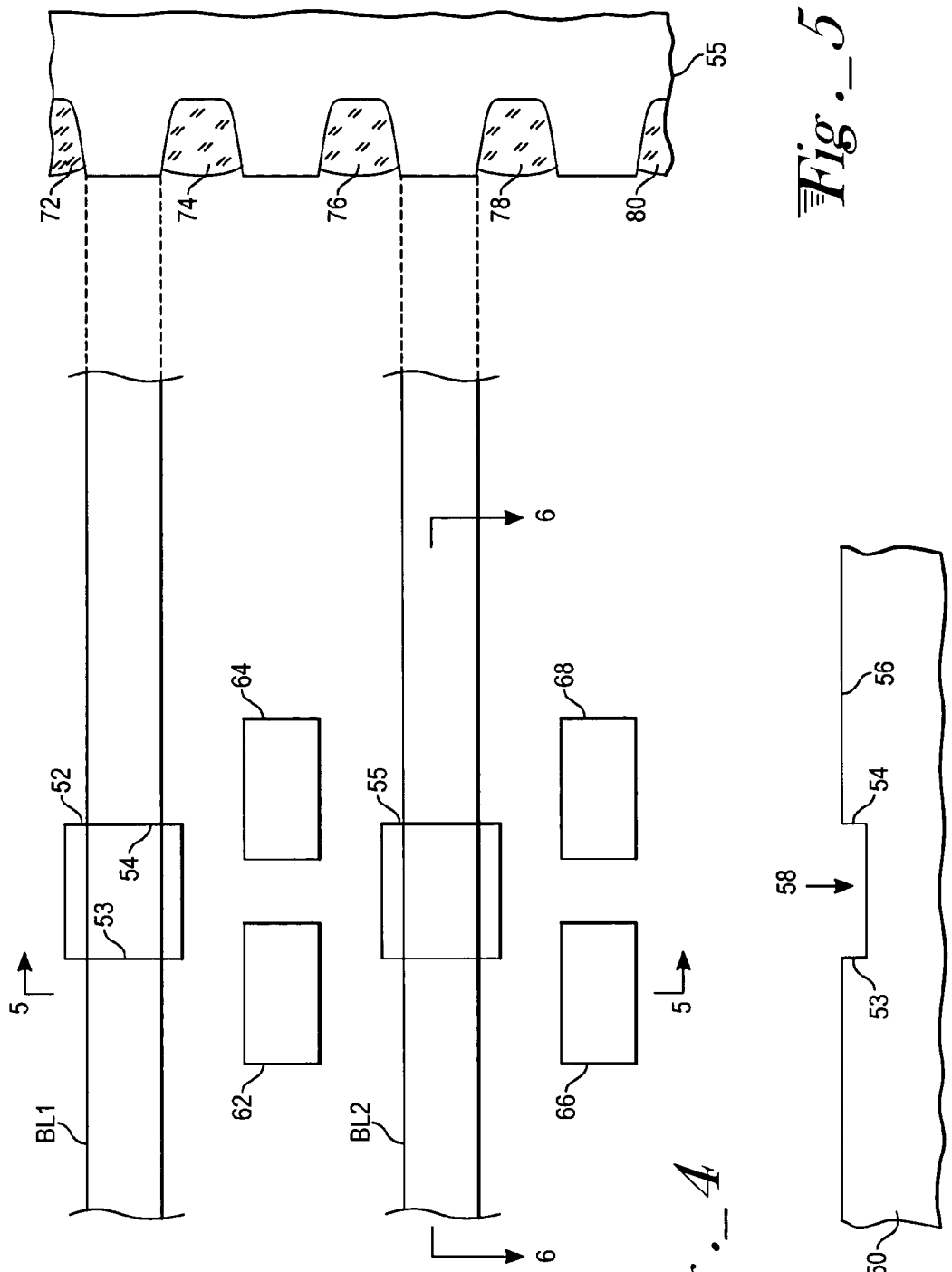

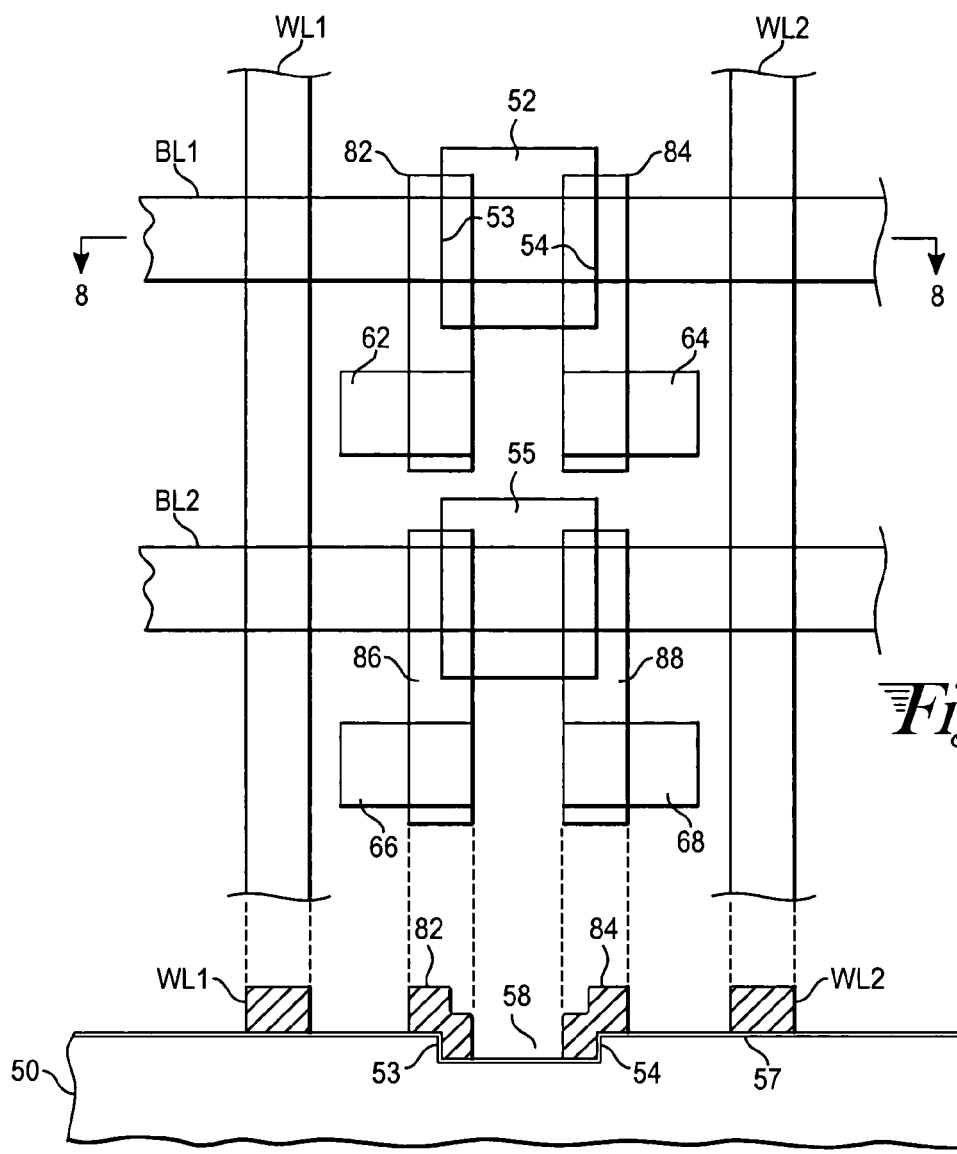
*Fig._7*
*Fig._8*
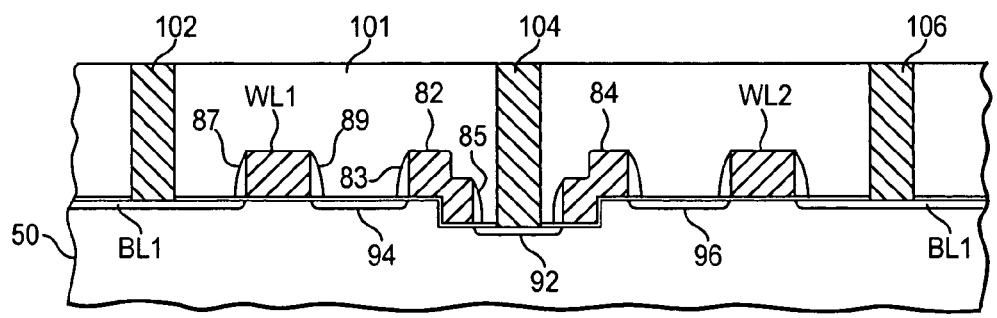
*Fig._9*

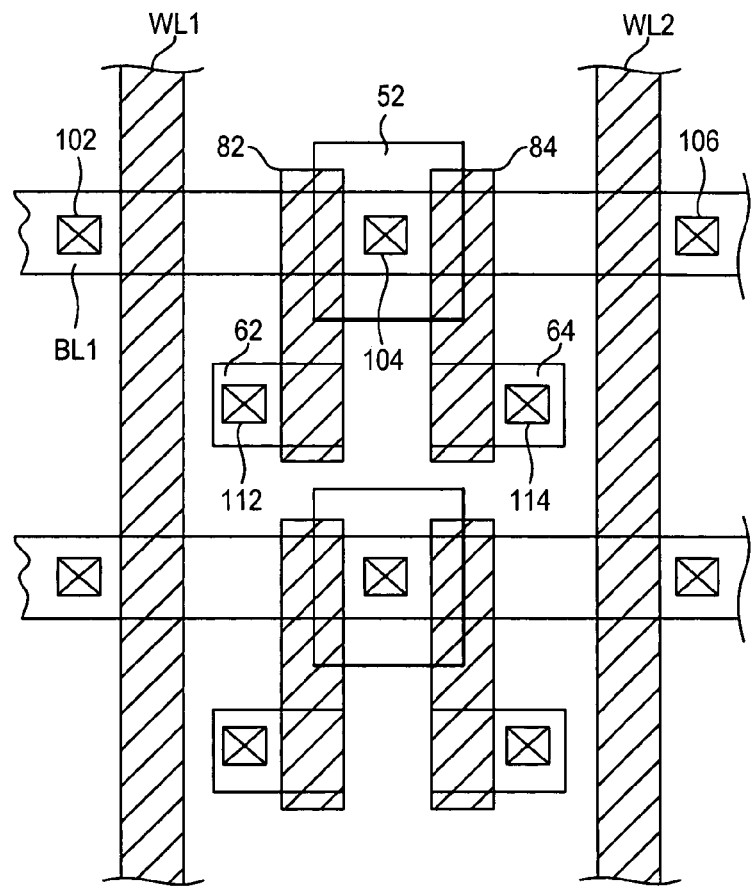
Fig._10
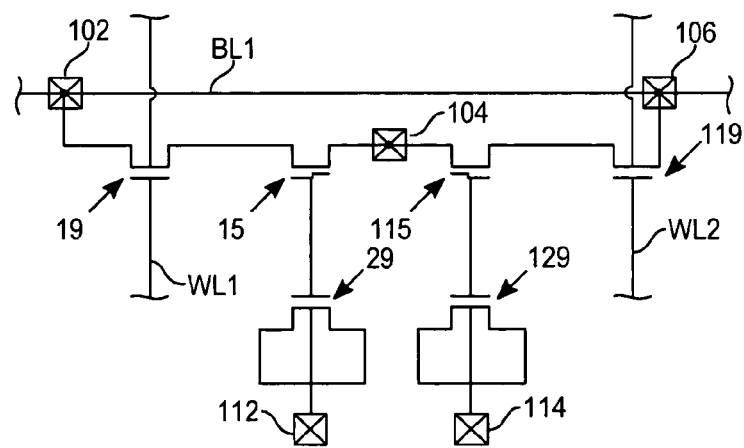
Fig._11

TWIN EEPROM MEMORY TRANSISTORS WITH SUBSURFACE STEPPED FLOATING GATES

CROSS-REFERENCE TO RELATED APPLICATION

This application is a continuation-in-part of prior application Ser. No. 10/423,637 filed Apr. 25, 2003 now U.S. Pat. No. 6,919,242, a continuation-in-part of prior application Ser. No. 10/465,718 filed Jun. 18, 2003 now U.S. Pat. No. 6,888,192, and a continuation-in-part of prior application Ser. No. 10/680,355, filed Oct. 6, 2003. All three applications are herewith incorporated by reference in their entirety.

TECHNICAL FIELD

The invention relates to non-volatile memory transistors and, in particular, to a compact arrangement of such memory cells for an array and a method of making them.

BACKGROUND ART

In prior application Ser. No. 10/423,637 entitled "Mirror Image Memory Cell Transistor Pairs Featuring Poly Floating Spacers," as well as in prior application Ser. No. 10/465,718 entitled "Mirror Image Non-Volatile Memory Cell Transistor Pairs with Single Poly Layer," both assigned to the assignee of the present invention, B. Lojek described an arrangement of non-volatile MOS memory transistors for a memory array wherein symmetric pairs of transistors were built in a memory array. Transistor pairs shared an electrode in a common well, such as a drain electrode, but were otherwise completely independent. The pair was manufactured between a pair of isolation regions and sharing the same substrate region, almost as if a single transistor were constructed there.

In the prior art, single MOS floating gate transistors that stored two data bits have been devised as a way to achieve compactness. Since millions of data bits are frequently stored in non-volatile memory arrays, small savings of space are multiplied significantly over the array. In prior application Ser. No. 10/327,336 entitled "Multi-Level Memory Cell with Lateral Floating Spacers," assigned to the assignee of the present invention, B. Lojek described how two spacers, on opposite sides of a conductive gate, behave as independent charge storage regions for separate binary data, thereby allowing a single non-volatile MOS transistor to store two binary bits. Each memory cell is connected to two bit lines and one word line. The bit lines are phased so that during a single clock cycle, first one bit line is active and then the other while a word line is active for the entire cycle. In this manner, both storage areas may be accessed for a read or write operation in a single clock cycle.

In U.S. Pat. No. 6,043,530 to M. Chang, a MOS memory transistor construction is shown employing band-to-band tunneling. In U.S. Pat. No. 6,323,088 to F. Gonzalez et al., a multibit charge storage transistor addressing scheme is shown with phased bit lines.

In the prior art, multibit charge storage structures are known that achieve good data density in a memory array without giving up valuable chip space. One of the problems that is encountered as density increases is that the amount of crosstalk between storage sites increases. Because the charge storage structures are so small, one charge storage location can sometimes influence another. On the other hand, separation of charge storage sites gives up chip space. The ultimate separation is one dedicated transistor for each data bit. Accordingly, an object of the invention is to provide good separation for data bits afforded by dedicated transistors yet achieve the compactness of multibit charge storage structures for a non-volatile memory array.

SUMMARY OF THE INVENTION

The above object has been achieved with a memory array having cells with twin EEPROM memory transistors that occupy a space almost the same size as a single EEPROM memory transistor. The twin transistors of each cell are symmetrically arranged in a common substrate and feature a single poly layer, with portions used as floating gates that are stepped below the level of the substrate surface, yet insulated from the substrate by thin oxide. The floating gate electrically communicates with a subsurface electrode that participates in charge transfer to the floating gate. The usual EEPROM control gate is replaced by a first capacitor wherein the same poly portion used to form the floating gate extends to form a second plate of the first capacitor. The first plate of the first capacitor is a control line connected to a phased signal source whereby phasing of plates of the twin cells allows each transistor to act independently. The drain of each transistor is connected to one plate of a second capacitor and to a bit line while the second plate is connected to a word line.

By stepping the floating gate into the substrate and forming a floating gate corner in the substrate, the intensity of electric field from a subsurface electrode will increase and enhance tunneling action.

BRIEF DESCRIPTION OF THE DRAWINGS

FIG. 1 is an electrical schematic drawing of memory cells forming the core of a memory array of the present invention.

FIG. 2 is a side sectional view of an early manufacturing step for a memory transistor in the memory cells of FIG. 1.

FIG. 3 is a top view of a mask for making a substrate step shown in the sectional view of FIG. 2.

FIG. 4 is a top view of a layout in an early manufacturing stage of twin memory cells shown in FIG. 1.

FIG. 5 is a side sectional view taken along lines 5—5 in FIG. 4.

FIG. 6 is a side sectional view taken along lines 6—6 in FIG. 4.

FIG. 7 is a top view of a layout in an intermediate manufacturing stage of twin memory cells shown in FIG. 1.

FIG. 8 is a side sectional view taken along lines 8—8 in FIG. 7.

FIG. 9 is a side sectional view following FIG. 8 at a later stage in manufacturing.

FIG. 10 is a top view of a contact mask superposed on the top view of FIG. 7, with conductor shading for the single polysilicon layer.

FIG. 11 is an electrical schematic drawing of twin symmetric memory cells shown in FIG. 1 redrawn for comparison with FIG. 10, including locations of contacts shown in FIG. 10.

BEST MODE FOR CARRYING OUT THE INVENTION

With reference to FIG. 1, a memory cell 13 in a memory array 10 is seen to have first and second non-volatile memory transistors 15 and 115, respectively. The first memory transistor 15 has a drain 21 connected to select capacitor 19, a floating gate 23 connected to control capacitor 29 and a source 25 connected to the source contact 27.

Select capacitor 19 has a first electrode 31 connected to drain 21 of first memory transistor 15 and also connected to the first bit line, BL1. The second electrode 33 of select capacitor 19 is connected to word line WL1. The word line WL1 is extended from first electrode 31 along line 35 into another cell. The floating gate 23 of memory transistor 15 is connected to a first electrode 37 of control capacitor 29, while second electrode 39 is connected to a first control line terminal 41. A pulse on terminal 41 charges the second electrode 39, causing induced charge to appear on first electrode 37 which forms a floating gate together with electrode 23. This is one of two ways in which charge appears on the floating gate 23. Another way for charge to appear is by tunneling or electron injection from source or drain electrode 21 and 25. When one voltage is applied to bit line BL1 and another voltage is applied at source contact 27 charge may be transferred onto the floating gate 23 by tunneling charge transfer mechanisms. Just as the word line WL1 extends into another memory cell in the same column along line 35, bit line BL1 is also extended into a memory cell in the same row along line 43.

The second memory transistor 115 is symmetric with first memory transistor 115 relative to source contact 27. The second memory transistor 115 has a floating gate 123 which may be charged by control capacitor 129. Memory transistor 115 has a drain electrode 121 connected to a first plate 131 of select capacitor 119 and a source electrode 125 connected to source contact 27. The first plate 131 is also connected to the bit line BL1. The second plate of capacitor 119 is connected to the word line WL2. The word line WL2 is extended from the first electrode 131 along line 135 to a control capacitor (not shown) into a neighboring cell in the same column. The bit line 43 similarly extends from the first electrode of select capacitor 119 into a neighboring cell in the same row.

Memory cell 13 is typical of the memory cells in the memory array 10. Each cell is seen to have twin non-volatile memory transistors that are symmetric about a source contact, such as source contact 27. The two memory transistors have floating gates associated with two control capacitors on the one hand and have drain or source electrodes associated with two select capacitors on the other hand. The two control line terminals 41 and 141 associated with the control capacitors allow programming of the two memory transistors so that each transistor is independent of the other, even though they share a common source electrode at source contact 27 and also share bit line BL1. Memory cell 13 is associated with two word lines, WL1 and WL2, as well as one bit line, BL1.

With reference to FIG. 2, a silicon p-type wafer provides a substrate doped to have a p-well with a surface 56, upon which a thin layer of oxide 57 is grown. The oxide layer has a thickness of approximately 100 angstroms. The oxide is covered with a thick photoresist layer 51 and then patterned with a mask 52, shown in FIG. 3. The mask is approximately square with a dimension near the lower limit of resolution of photolithography. The photoresist is then etched so that well-defined steps 53 and 54 form a depression 58 with upper and lower corners to a depth of approximately 500 angstroms below the substrate surface 56. The facing corners of steps 53 and 54 will enhance the electric field near the floating gates of twin memory transistors extending into the planar surface of the wafer. Corners at the top and bottom of each step are important for increasing electric field intensity to enhance tunneling. The floating gates are built upon the steps but insulated from the substrate by gate oxide 57.

With reference to FIG. 4, a mask set is shown defining the active regions of two memory cells. The mask set includes masks 52 and 55 for defining common source electrodes of twin EEPROMs and masks 62 and 64, as well as masks 66 and 68 for defining control lines. Two linear masks define parallel bit lines BL1 and BL2. The areas surrounding the masks are isolated by a shallow trench isolation, as shown in FIG. 5. Trenches in p-well or p-substrate 50 (FIG. 6) of a p-type silicon wafer substrate are filled with dielectric insulator material 72, 74, 76, 78, and 80 (FIG. 5), typically silicon dioxide. The areas that are not dielectric material are subject to doping either by diffusion or implantation. This allows the memory cells to have diffused bit lines BL1 and BL2.

Turning to FIG. 6, when doping of subsurface regions is complete, the substrate is coated with oxide, previously described in FIG. 2 but not shown in FIG. 6, and the depression 58 is formed below the surface 56 of substrate p-well substrate 50. The depression 58 has steps or corners 53 and 54 that will form part of floating gates of memory transistors. The steps or corners 53 and 54 may be seen in FIG. 4 also.

With reference to FIG. 7, the diffused regions previously described with reference to FIG. 4 may be seen. The diffused regions include the areas where source masks 52 and 55 as well as the control line diffusions 62, 64, 66, and 68. The diffused bit lines BL1 and BL2 are also seen. All of these structures lie below the surface of the p-well, or p-substrate, including steps or corners 53 and 54.

A layer of poly is deposited over the substrate surface and then etched leaving floating members 82, 84, 86, and 88. Portions of these floating members will become floating gates of twin EEPROM transistors. The floating members have portions extending over the control line diffusions 62 and 64, as well as control line diffusions 66 and 68. Portions of the floating members also extend over the source mask regions 52 and 55. The poly layer is also used to define word lines WL1 and WL2, spaced apart and lying outwardly of the cell core.

In FIG. 8, the p-well substrate 50 is seen with gate oxide layer 57 over the substrate surface including the depression 58. The poly layer deposited over the substrate has portions which define floating gates 82 and 84 that follow the contour of steps or corners 53 and 54. Outwardly of the floating gate regions 82 and 84 are poly word lines WL1 and WL2.

FIG. 9 follows FIG. 8 at a further point in the manufacturing process. Subsurface implants have been made in p-well substrate 50, particularly source implant 92, as well as drain implants 94 and 96. The subsurface bit line diffusions BL1 are also seen. The poly floating gates 82 and 84 have sidewall spacers, such as sidewall spacers 83 and 85 surrounding floating gate 82. Similarly, word lines WL1 and WL2 have sidewall spacers such as spacers 87 and 89 associated with word line WL1. After the spacers have been constructed, a layer of interlayer dielectric, ILD layer 101, is deposited over the poly one layer. The ILD layer 101 is masked and etched to create holes that allow insertion of metal contacts 102, 104, and 106. These conductive metal contacts make contact with subsurface regions. Metal contacts 102 and 106 contact the diffused bit line BL1. Metal contact 104 contacts a common subsurface electrode 92. The relation of the metal contacts with the top view of FIG. 7 may be seen in FIG. 10.

In FIG. 10, the position of metal contacts 102, 104, and 106 may be seen. Also, contacts 112 and 114, associated with the control line diffusions 62 and 64, may be seen. Contact 104 is located in the center of mask 52 that defines a common electrode for twin side-by-side memory transistors. In other words, contact 104 is located at a plane of symmetry for the twin EEPROM transistors. In FIG. 10, the single poly layer has been shaded, with portions of the layer forming poly members 82 and 84, defining the contoured floating gates associated with the subsurface steps toward the common source electrode. Other portions of the poly one layer define the word lines WL1 and WL2, as indicated by shading. Note that the poly members 82 and 84 extend over the control line diffusions 62 and 64. These control line diffusions have metal contacts 112 and 114, respectively.

In FIG. 11 positions of the contacts of the memory cell in the top view of FIG. 10 are indicated relative to an electrical schematic of a memory cell as shown in FIG. 1. A total of five contacts is used for each cell with two contacts, 102 and 106, being on the bit line BL1. The contact 104 is associated with the common source between the twin symmetric memory transistors. The contacts 112 and 114 are associated with capacitors 29 and 129. FIG. 11 may be projected upwardly, towards FIG. 10, where a rough comparison can be made of the various circuit elements. In FIG. 10, the word line WL1 is seen to overlie the bit line BL1 but spaced apart by insulator thereby forming capacitor 19 in FIG. 11. Similarly, a portion of poly member 82 is seen to overlie control line diffusion 62 thereby forming capacitor 29 in FIG. 11.

What is claimed is:

1. A non-volatile memory array having rows and columns of memory cells, each cell comprising:

first and second non-volatile memory transistors symmetrically arranged in a common substrate having a planar surface and sharing a common electrode, each memory transistor having a first portion of a single layer of poly electrically floating over the substrate in a configuration having a step that extends below the planar surface of the substrate and separated from the substrate by an oxide layer thereby allowing the floating poly layer to act as a floating gate and having a capacitor connected thereto configured to act as a control electrode, the floating gate capable of electrically communicating with a subsurface electrode through the oxide layer;

first and second word lines outward of the first and second memory transistors, respectively, the word lines shared by a plurality of memory cells in the same column, a bit line transverse to the word lines in capacitive relation therewith and also in capacitive relation to the floating gates of the first and second memory transistors; and first and second control lines, each being a plate of the capacitor associated with each memory transistor.

2. The array of claim 1 wherein the common electrode is a subsurface source or drain electrode, the symmetric arrangement of the memory cells being relative to the common electrode.

3. The array of claim 1 wherein the first and second control lines are phased thereby providing momentary exclusive use of the common electrode by one of the memory cells.

4. The array of claim 1 wherein the bit line is diffused into the substrate.

5. The array of claim 1 wherein the word lines are disposed above the substrate and separated therefrom by an oxide layer.

6. The array of claim 1 wherein the first and second control lines are spaced apart and co-linear.

7. The array of claim 5 wherein the first and second word lines are second portions of the single poly layer.

8. The array of claim 1 wherein said step extends below the planar surface of the substrate by a depth equal to 400 to 600 Angstroms.

9. The array of claim 1 wherein said step has top and bottom corners.

10. The array of claim 6 wherein the co-linear control lines are separated from bit lines of neighboring memory cells in the same column by a distance occupied by shallow trench isolation trenches.

11. The array of claim 6 wherein the co-linear control lines are diffused into the substrate.

* * * * *